US009929025B2

(12) United States Patent
Moore

(10) Patent No.: US 9,929,025 B2
(45) Date of Patent: Mar. 27, 2018

(54) CASSETTE FIXTURE FOR HOLDING FILM FRAMES WITH AFFIXED THIN SUBSTRATES DURING LIQUID CHEMICAL BATCH REMOVAL OF CARRIERS

(71) Applicant: John Cleaon Moore, Camirillo, CA (US)

(72) Inventor: John Cleaon Moore, Camirillo, CA (US)

( * ) Notice: Subject to any disclaimer, the term of this patent is extended or adjusted under 35 U.S.C. 154(b) by 237 days.

(21) Appl. No.: 14/894,115

(22) PCT Filed: Jun. 5, 2014

(86) PCT No.: PCT/US2014/041027
§ 371 (c)(1),
(2) Date: Nov. 25, 2015

(87) PCT Pub. No.: WO2014/197662
PCT Pub. Date: Dec. 11, 2014

(65) Prior Publication Data
US 2016/0104633 A1    Apr. 14, 2016

Related U.S. Application Data

(60) Provisional application No. 61/831,938, filed on Jun. 6, 2013.

(51) Int. Cl.
*B32B 38/10* (2006.01)
*H01L 21/67* (2006.01)
(Continued)

(52) U.S. Cl.
CPC .. *H01L 21/67092* (2013.01); *H01L 21/67132* (2013.01); *H01L 21/67313* (2013.01);
(Continued)

(58) Field of Classification Search
CPC .. B32B 38/10; B32B 43/006; Y10T 156/1111; Y10T 156/1116
(Continued)

(56) References Cited

U.S. PATENT DOCUMENTS 5,800,665 A * 9/1998 Okaniwa ............. B32B 43/00
134/104.3
6,076,585 A * 6/2000 Klingbeil, Jr. ...... H01L 21/6732
118/503
(Continued)

*Primary Examiner* — Mark A Osele
*Assistant Examiner* — Nickolas Harm
(74) *Attorney, Agent, or Firm* — Andrew Auerbac

(57) ABSTRACT

The invention describes the ability to conduct multiple carrier substrate removal practices simultaneously. The fixture design is slotted in a manner to hold film frame rings and has the bottom region open without interference to the passage of the released carrier substrate. Slots in the fixture are arranged on two sides at top and bottom to support the film frame, however, the distance between the slots and the area of the open region is sufficient to allow the carrier substrate to travel downwards under gravity force, once it has been released from the device wafer. The method describes a batch process whereby a fixture design supports multiple film frames with taped adhered device wafers enable exposure to a chemical medium that either acts upon the interface between the device wafer and carrier substrate or digests the carrier substrate in a manner that results in removal.

10 Claims, 2 Drawing Sheets

Figure 1:
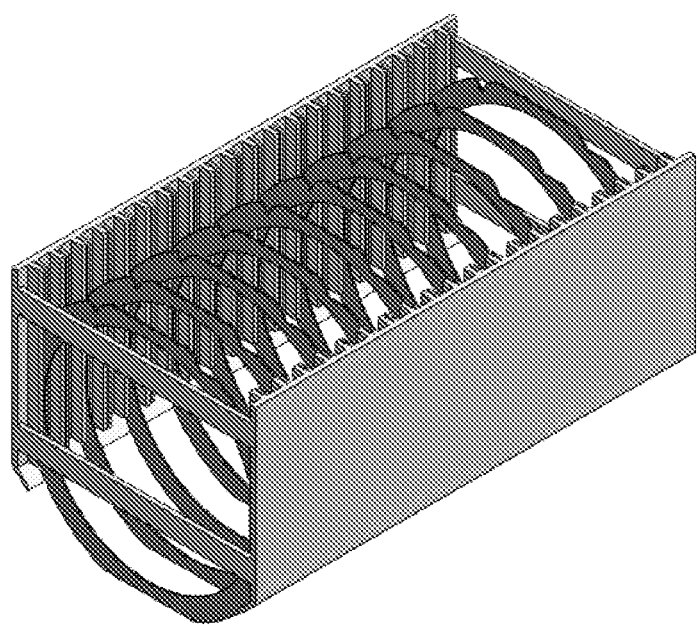

(51) Int. Cl.
*H01L 21/673* (2006.01)
*B32B 43/00* (2006.01)

(52) U.S. Cl.
CPC ........ *H01L 21/67346* (2013.01); *B32B 38/10* (2013.01); *B32B 43/006* (2013.01); *Y10T 156/1111* (2015.01); *Y10T 156/1116* (2015.01)

(58) Field of Classification Search
USPC .............................. 156/703, 704, 930, 941
See application file for complete search history.

(56) References Cited

U.S. PATENT DOCUMENTS

| 6,601,592 B1* | 8/2003 | Chen ................ H01L 21/67781 |
| | | 134/1.3 |
| 2002/0104616 A1* | 8/2002 | De .................... H01L 21/67132 |
| | | 156/701 |

* cited by examiner

CASSETTE FIXTURE FOR HOLDING FILM FRAMES WITH AFFIXED THIN SUBSTRATES DURING LIQUID CHEMICAL BATCH REMOVAL OF CARRIERS

FIELD OF THE INVENTION

The present invention relates generally to the handling of thinned substrates mounted to rigid carriers for support. Specifically, the invention describes a cassette fixture that holds the film frames affixed to the thinned substrates with bonded support carriers. More specifically, the cassette fixture is designed in a manner and with materials of construction to allow immersion into liquid chemistry to facilitate debonding (removal) of the rigid carriers. In particular, the immersion liquid is of a specific chemistry, such that it may penetrate and effect removal of the adhesive that bonds the thinned substrate to the carrier but does not adversely affect the tape that is present on the film frame. The value and importance of a cassette fixture to support film frames designed to be immersed into a chemical liquid allows a batch process arrangement to occur for the removal of the rigid carriers from thin electronic devices such as semiconductors, microelectromechanical systems (MEMS), solar, displays, and other thin solid materials which must be supported during their manufacturing. Batch removal processes aid manufacturing by increasing throughput without significant burdens of additional equipment or cost.

BACKGROUND OF THE INVENTION

Electronic devices face continued pressure to design and produce their configurations in a further state of miniaturization, ergonomically pleasing shapes, and a reduced weight. To achieve these goals, substrates must be thinned to 100 um (microns) and less, making them extremely fragile and difficult to handle with existing equipment. To prevent breakage, cracking, or otherwise chipping and stressing these fragile substrates, it becomes necessary to always keep them temporarily supported by an external platform, being a rigid carrier or a membrane. During microelectronic manufacturing, the thinned substrates are temporarily supported by rigid carriers, as these provide the most secure and reliable media to conduct high-resolution processes. These carrier substrates may be composed of sapphire, quartz, certain glasses, or silicon and exist in thicknesses from 0.5-1.5 mm (millimeters=500-1,500 um). The device substrate is commonly affixed to the carrier by an adhesive that offers sufficient adhesive force and quality to withstand the manufacturing process, while also allowing the thinned substrate to be removed at the completion of work without damaging to its integrity.

Common tape adhesives exist which offer temporary support to the device substrate either alone or used as an interface to the carrier. These materials are commonly used for dicing operations, including high-volume photodegradative delamination practices (i.e. pick-and-place). However, tape adhesives are reserved only for the end of the process where dicing occurs. Most tape adhesives are not used in upstream microelectronic processes as their properties do not meet the needs for fabrication, including rigidity and uniformity, thermal and chemical resistance, and outgassing (weight loss). These shortcomings in adhesive tapes result in loss of adhesion, gas bubbles lodged in-between the device substrate and carrier, or produce unwanted gaseous by-products of degradation, which will adversely interact, with the processes of vacuum deposition or etching to produce inferior results.

In the example where thinned substrates include semiconductor wafers, the device wafer is commonly removed from a carrier support, cleaned, and mounted to a film frame containing tape adhesive, allowing the dicing process to proceed. Carrier removal is conducted with robotic assisted complex tooling. Tooling is designed according to the type of adhesive chosen. At the time of this invention, there are no less than six (6) adhesive materials on the market. The majority of these adhesives require a single wafer tooling configuration whereby the tool handles one wafer at a time.

Single wafer processes that use thermoplastic adhesives may utilize thermomechanical demounting as taught in U.S. Pat. No. 6,792,991 B2, Thallner, and 2007/0155129 (2007), Thallner. Device wafer separation is achieved by heating the mounted stack to a temperature above the melting point of the thermoplastic adhesive while simultaneously applying a shear force in a manner designed to separate the mounted surfaces. Cleaning with a selected organic solvent typically follows to ensure residual adhesive is cleaned from the substrate.

Another single-wafer tooling practice for removing carrier supports is described in U.S. Patent Application Nos. 2009/0017248 A1 (2009), Larson et al., 2009/0017323 A1 (2009), Webb et al., and in the International Application WO 2008/008931 A1 (2008), Webb et al. The adhesive described is a bilayer system composed of a photothermal conversion layer and a curable acrylate. The applications cite the use of a laser irradiation device which allows rapid demount of the external support carrier and is followed by a mechanical peeling practice of the curable acrylate from the thinned substrate.

Additional laser ablative carrier demounting practices are described in U.S. Pat. No. 6,036,809, Kelly, et. al, U.S. Pat. Nos. 7,867,876B2, and 7,932,614B2, Codding, et. al. Laser ablative tooling is non-trivial, in that it requires exacting focus of an optical device of a specific wavelength and to do this onto an interface between the work unit and the carrier substrate. The laser's focus does this while it or the substrate is being shifted in continual motion moving rapidly across the substrate. It is well known to those familiar with the art of coatings and planarization efforts that irregularities will exist in materials applied over the surface of the work unit. The adhesives used for these practices vary between rubber, silicone, polyimide, acrylic, and the like. The laser transmits through an optically clear carrier substrate and focuses onto the interfacial region where the adhesive meets the carrier, causing a significant and immediate rise in temperature to burning of that material to destroy its adhesion to the carrier. There is a micro area of impact that absorbs this temperature rise and fall during contact. The laser continues to move to the next location in an apparent smooth fashion until the entire surface of the substrate has been exposed and thereupon the release of the work unit is expected. The impacts of this process is realized later when irregularities are observed as micro-cracks, fissures, and residue that is burnt onto surfaces which cannot be removed. Laser ablative processes, although a common practice for debonding delicate substrates, remains a subject of much discussion when considered for high volume manufacturing.

These and other carrier debonding (removal) practices are discussed in U.S. Patent Application No. 2009/0218560A1, Flaim, et. al, where the author consolidates the practice of wafer and carrier separation into four approaches. These include 1) chemical, 2) photodecomposition (laser ablation), 3) thermomechanical, and 4) thermal decomposition. Although the author mentions drawbacks in each mechanism, they refrain from classifying them as single-wafer or batch processing according to their respective tooling configuration. Of these four processes, only chemical penetration is considered as a batch mechanism. In such processes, wafers may be populated into a cassette or holder and immersed into a chemical liquid for a designated time to allow penetration into the adhesive, emulsification, and removal to allow carrier debonding. As mentioned in U.S. Patent Application No. 2009/0218560A1, Flaim, et. al, chemical debonding may require hours to complete. At the time of this document writing, common throughput for single wafer processes may vary between 8-12 wafers per hour (wph). In the case of a conventional chemical debond, cassettes of between 12-25 wafers are used and may last up to four (4) hours. For a bath size of >100 liters as common for most fabrication facilities in Asia, this volume can accommodate up to 4 cassettes at a time, providing throughputs between 12-25 wph, exceeding that for single wafer processes (i.e. 12-25 wafers per cassette×4 cassettes=48-100 wafers/4 hrs=12-25 wph). Without being bound to variations of the art of batch processing, this option is needed in fabrication to offer lower cost options for debonding carrier substrates. Therefore, it is a desire to consider batch wafer processing as a viable and cost effective practice for thin substrate debonding from carriers.

Batch debonding processes are described in U.S. Pat. No. 6,076,585, Klingbeil, et. al, and U.S. Pat. No. 6,491,083 B2, De, et. al, where a fixture holding thinned gallium arsenide (GaAs) wafers are removed from sapphire carriers using an immersion chemical practice. In both of these inventions, the fixture is designed to operate with the wafers held horizontally. The fixture has steps machined within it and requires a perforated carrier substrate that is slightly larger in diameter than the device wafer, such that during the debonding operation, the separation of the two substrates occurs by one item landing upon the fixture step while the wafer separates and falls to a lower level of support. Carrier substrates that are machined to be larger in diameter than the work unit and which have perforations can be costly. For example, enlarged perforated sapphire substrates are a common choice for GaAs work unit wafers, however, these can cost $1,000 or more for each piece. In the case of silicon substrates of diameters at 12" or 18", carrier wafers are chosen to be dummy type (i.e. same size, shape, and composition of the work unit without the electronic purity). Oversized perforated carriers are cost prohibitive for silicon processes as their cost can fall between factors of 10-100× that of conventional dummy sized wafers. It is a desire to avoid fixtures that require oversized perforated carriers and instead use fixtures that accept dummy wafers as carriers for thin wafer handling as a means to minimize process costs.

A batch demounting process is also described in U.S. Pat. Nos. 6,601,592 B1 and 6,752,160, Zhengming Chen, where two fixture cassettes work in conjunction with each other in a manner that allows separation of the device wafer from carrier substrates. The inventions describe the batch process separation between device wafer and carrier as conducted such that the top fixture cassette is populated with the mounted wafers whereby during liquid immersion, the chemistry penetrates the adhesive contact to release the two substrates. The top fixture cassette is constructed in a manner to allow only the device wafer pass downwards to the lower fixture cassette during gravity assisted separation, retaining the carrier substrate. The inventions require the sized of the carrier substrate and device wafer to be different, either the device wafer to exhibit a flat edge (i.e. wafer flat) or the carrier substrate to be oversized as compared to the device wafer. In either case, when the process commences and the fixture cassettes are arranged vertically, the oversize carrier is held back within the above fixture cassette while the device wafer travels from the top to the bottom cassette. Device wafers with a flat location were at one-time popular for reasons of reference location when handling and transferring from one process to another. The wafer flat is less desirable as it eliminates valuable device manufacturing realty on the wafer and reduces the number of devices built upon a substrate. Conversely, oversized carrier wafers are cost prohibitive as described earlier in this document. Further and most important, these inventions describe fixture design that requires the device wafer to be separated and released from the carrier substrate and move freely from one fixture cassette to another during liquid chemical immersion processing. It is commonly understood in the practice of thin wafer handling, that at anytime during this work, the device wafer should always be supported and never left to move freely. Consistent device wafer support would minimize irregular bending, vibration, and edge contact that would generate cracks, chipping, and other flaws within a thin wafer. It is a desire to avoid fixtures that require device wafer flat designs or oversized carriers and to avoid fixtures that promote a batch processing practice which allows the device wafer to move freely and subject itself to cracks, flaws, or other signs of breakage.

A unique carrier formation and process for separation from the device wafer is described in the International Publication No. WO 210/107851 A2 (International Application No. PCT/US210/027560), Moore, et al, where a carrier substrate is manufactured (formed) directly onto the device wafer in a manner sufficient to support grinding and backside processing and when complete, the materials used to form the carrier are designed to break down in a liquid chemistry cleaning process. Carrier supports which are removed by chemical breakdown during a special cleans process require a special fixture to allow the device wafer to remain in tact and without damage. These batch clean designs and would require a fixture that would support multiple device wafers during carrier removal. It is a desire to use fixture designs that promote a batch processing practice which allow the device wafer to be held secure while the carrier is allowed to be chemically broken down by a chemical fluid or otherwise be removed.

For these reasons and others not mentioned, it is a desire to perform batch process separation (debonding) of carriers from device wafers in a manner that accepts low-cost dummy wafers as carriers and maintains support of the device wafer throughout the process.

SUMMARY OF THE INVENTION

This invention is directed to a method and apparatus for a non-manual method of demounting semiconductor substrates from their support substrates simultaneously and efficiently without damaging the semiconductor substrates.

A preferred version of the process of separating one or more semiconductor substrates from one or more support substrates having features of the present invention comprises the following steps. The first step comprises providing an apparatus having: (a) a top cassette having a plurality of vertical slots, and one or more small bars for stopping the support substrate from exiting the top cassette; and (b) a bottom cassette having a plurality of vertical slots. The next step comprises vertically inserting the semiconductor substrate into the slot of the top cassette while the semiconductor substrate is coupled to the support substrate, wherein the surfaces of each semiconductor substrate is positioned approximately parallel to a force of gravity during the inserting step. Then, the supporting step comprises supporting the support substrate above the small bars in the top cassette. Next, the introducing step comprises introducing the apparatus to a dissolving agent to separate the semiconductor substrate from the support substrate, wherein the first surface of each semiconductor substrate is positioned approximately parallel to the force of gravity during the introducing step, and wherein the force of gravity moves the semiconductor substrate from the top cassette towards the bottom cassette. The next step comprises removing the top cassette from the apparatus. This is followed by the exposing step that comprises exposing the apparatus to a cleaning agent to clean the semiconductor substrate. Next step comprises drying the semiconductor substrate after the cleaning step.

In another embodiment of the present invention, the providing step further comprises a basket in which the bottom cassette and the top cassette are placed.

In yet another embodiment of the present invention, the providing step further comprises providing the bottom cassette having a first wall, a second wall substantially parallel to the first wall and coupled to the first wall, a large bar embedded inside the first wall; and a large bar embedded inside the second wall, such that a distance between the two bars is shorter than a greatest surface length of the semiconductor substrate.

In yet still another embodiment of the present invention, the providing step further comprises providing the bottom cassette having a tapered end such that the semiconductor substrate is stopped from exiting the bottom cassette through the tapered end.

In another embodiment of the present invention, the providing step further comprises providing the support substrate that is optically transparent.

In still embodiment of the present invention, the providing step further comprises providing the support substrate having one or more via holes.

In another embodiment of the present invention, the inserting step further comprises preventing the small bars from contacting the semiconductor substrate.

In yet another embodiment of the present invention, the moving step further comprises moving the semiconductor substrate towards the bottom cassette without removing the semiconductor substrate from the apparatus.

In yet still another embodiment of the present invention, the introducing step further comprises exposing the semiconductor substrate to a chemical to release the semiconductor substrate from the support substrate.

In still another embodiment of the present invention, the introducing step further comprises heating the semiconductor substrate to release the semiconductor substrate from the support substrate.

In another embodiment of the present invention, the introducing step further comprises subjecting the apparatus to an ultrasonic treatment to release the semiconductor substrate from the support substrate.

A preferred version of the apparatus of separating one or more semiconductor substrates from one or more support substrates having features of the present invention comprises a top cassette having one or more small bars for stopping the support substrate inside the top cassette, and a bottom cassette for receiving the semiconductor substrate.

In another embodiment of the present invention, the bottom cassette has one or more large bars such that the semiconductor substrate remains inside the bottom cassette after being received.

In yet another embodiment of the present invention, the bottom cassette has one or more tapered ends such that the semiconductor substrate remains inside the bottom cassette after being received.

In yet still another embodiment of the present invention, the apparatus further comprises a basket in which the bottom cassette and the top cassette are placed.

In still another embodiment of the present invention, the apparatus further comprises the top cassette and the bottom cassette having a first wall, a second wall being substantially parallel to the first wall and coupled to the first wall, a plurality of tabs extending from each wall towards the other wall, wherein the plurality of tabs have approximately equal lengths and are substantially coplanar with each other.

In another embodiment of the present invention, the apparatus further comprises: (a) the top cassette having one or more top pins extending from a bottom surface of the first wall, and one or more top pin apertures on a bottom surface of the second wall; (b) the bottom cassette having one or more bottom pins extending from a top surface of the second wall, and one or more bottom pin apertures on a top surface of the first wall. The top pin on the top cassette is inserted into the bottom pin aperture on the bottom cassette. The bottom pin on the bottom cassette is inserted into the top pin aperture on the top cassette. The plurality of tabs on the top cassette is substantially aligned with the plurality of tabs on the bottom cassette. The top cassette and the bottom cassette are attached in vertical alignment.

In yet another embodiment of the present invention, the apparatus further comprises the bottom cassette having the first wall and the second wall made of metal coated with tetrafluoroethylene polymer fiber.

In yet still another embodiment of the present invention, the small bar is made of a material containing tetrafluoroethylene polymer fiber.

In still another embodiment of the present invention, a first small bar is embedded within an aperture on the first wall and a second small bar is embedded within an aperture on the second wall, such that a distance between the two small bars is shorter than a greatest surface length of the supporting substrate but longer than a greatest surface length of the semiconductor substrate.

Another preferred version of the apparatus of separating one or more semiconductor substrates from one or more support substrates having features of the present invention comprises a top cassette and a bottom cassette. Each cassette has a first wall, a second wall being substantially parallel to the first wall and coupled to the first wall, a first interior surface on the first wall facing towards the second wall, a second interior surface on the second wall facing towards the first wall. Each cassette also has a plurality of tabs extending from the first interior surface towards the second interior surface, where the tabs have approximately equal lengths and are substantially coplanar with each other. It also has a plurality of tabs extending from the second interior surface towards the first interior surface, where the tabs have approximately equal lengths and are substantially coplanar with each other. The top cassette has one or more small bars made of a material containing tetrafluoroethylene polymer fiber along the interior surface of at least one wall for stopping the support substrate inside the top cassette from dropping into the bottom cassette. The bottom cassette for receiving the semiconductor substrate has a stopping means to hold the semiconductor substrate within said bottom cassette after being received. The top cassette is capable of receiving the semiconductor substrate, and the support substrate is coupled to the semiconductor substrate in a manner whereby a first surface of the semiconductor substrate is positioned substantially parallel to a force of gravity. The top cassette is attached to the bottom cassette, such that the plurality of tabs on the top cassette is substantially aligned with the plurality of tabs on the bottom cassette, such that the top cassette and the bottom cassette are attached in vertical alignment.

In another embodiment of the present invention, the apparatus further comprises the top cassette further comprising one or more top pins extending from a bottom surface of the first wall, and one or more top pin apertures on a bottom surface of the second wall. The apparatus also has the bottom cassette further comprising one or more bottom pins extending from a top surface of the second wall, and one or more bottom pin apertures on a top surface of the first wall. The top pin on the top cassette is inserted into the bottom pin aperture on the bottom cassette and the bottom pin on the bottom cassette is inserted into the top pin aperture on the top cassette, such that the top cassette and the bottom cassette are attached in vertical alignment.

DESCRIPTION OF THE PREFERRED EMBODIMENTS

FIG. 1 outlines a fixture that supports multiple device wafers during the removal of affixed carrier substrates by a batch design process whereby the fixture is allowed to be submerged into a liquid chemistry.

Figure 2:
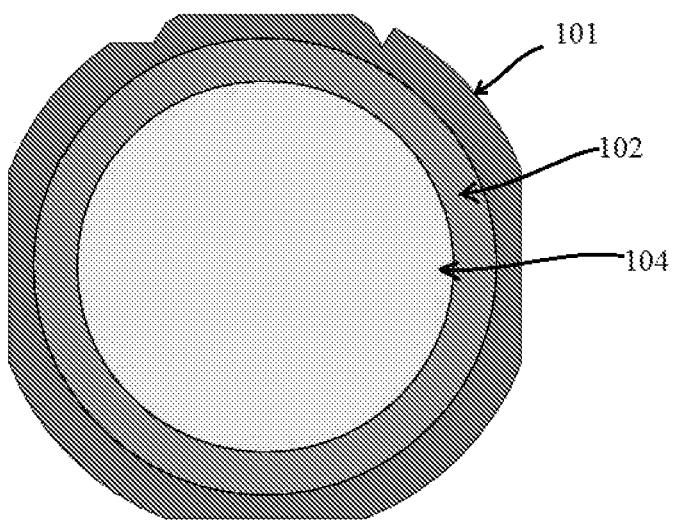

FIG. 2 illustrates the support mechanism for device wafers that are intended to be populated into the batch processing fixture identified in FIG. 1. In FIG. 2, the support mechanism is identified as a film frame, which comprises both the film frame ring 101 and tape 102. The tape 102 has affixed to its tacky surface the bonded stack of the thinned device wafer 103 (not shown) and carrier 104. Those skilled in the art and practitioners in the field recognize that the film frame 101 containing adhesive tape 102 is a specific tool designed to support thin device wafer 103, commonly during dicing practices.

Figure 3:
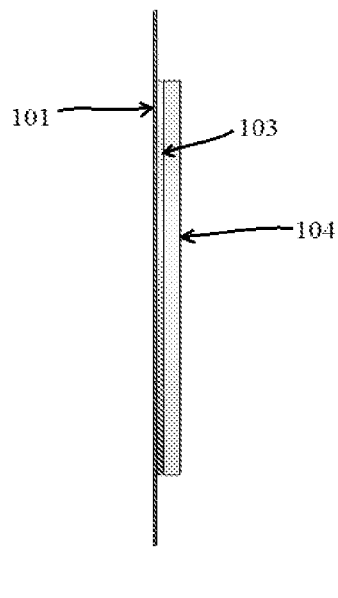

FIG. 3 illustrates a side view of film frame in FIG. 2, showing the film frame ring 101, tape 102 (not shown), affixed thinned device wafer 103, and carrier 104.

Figure 4:
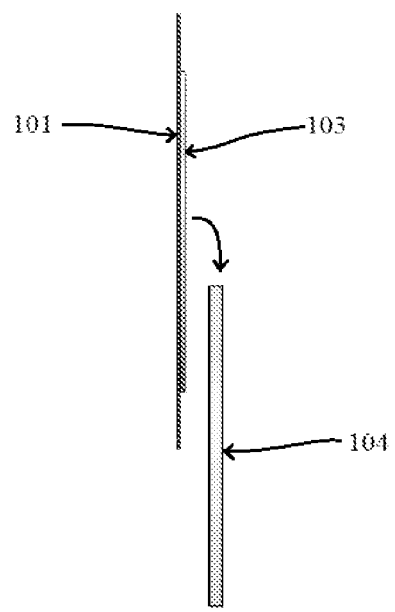

FIG. 4 illustrates the removal of the carrier 104 from the thinned device wafer 103 that remains bonded to the tacky adhesive tape 102 (not shown) held by the film frame ring 101. The removal of carrier 104 from the device wafer 103 that is affixed to film frame 101 via adhesive tape 102 (not shown) occurs within the fixture of the present invention shown in FIG. 1.

For simplicity and clarity of illustration, the drawings are not necessarily drawn to scale. Furthermore, the same reference numbers in different figures denote the same elements.

DETAILED DESCRIPTION OF THE DRAWINGS

The following describes in detail one embodiment of the invention and several variations of that embodiment. This discussion should not be construed, however, as limiting the invention to those particular embodiments. Practitioners skilled in the art will recognize numerous other possible embodiments as well as the ones specifically described. For a definition of the complete scope of the invention, the reader is directed to the appended claims.

This invention allows a highly efficient, high capacity batch demounting process for separating carrier support substrates from thinned semiconductor substrates in contrast to a single semiconductor substrate separation process (i.e. single wafer process). The invention may be manufactured of a range of materials that their choice is dependent upon the material's compatibility with the liquid chemical. For example, aluminum may be a common and inexpensive metal of choice for accepting film frame rings, however, aluminum is not compatible with many alkaline reagents without proper inhibition of metal corrosion or is not compatible with halogenated acids. Alternatively, stainless may be a better choice, however, this choice is more concerned with the type of halogenated acid and concentration. Teflon™ (a trade name for Du Pont's polytetrafluoroethylene resin) may be a better choice for compatibility, however, the weight of the cassette may become excessive, as Teflon™ has a density of 2.2 g/cm$^3$. Other related materials to Teflon™ perfluoroalkoxy (PFA) and fluorinated ethylene propylene (FEP). Teflon™, PFA, and FEP are all related and are thermoplastics, however, they differ in their melting temperatures of >300 C, 300 C, and 260 C, respectively. PFA is considered superior to the others based upon it being used as a coating, such as on aluminum or stainless.

During the batch processing of carrier removal, it is expected that carriers will be removed by a variety of means. The method of removal will be determined by the bonding configuration and type of carrier chosen. In the case of carrier breakdown and dissolution, the tool will be one that can accept any breakdown products, solids, particles, or other materials used in the composite manufacture. Alternatively, where the carrier is simply removed by sliding away from the device wafer surface, it is desired for that unit to simply fall by gravity from the invention fixture, leaving behind the device wafer affixed to the film frame tape. Collections of the carrier substrates are a secondary consideration to this invention practice. The carrier substrates are thick ceramic species and are more robust in form as compared to the thinned device wafer. A common approach may be the collection to be conducted using baskets or other similar arrangement. The efficiency and smoothness in processing such carrier removal and the collection of such substrates is not a limiting factor of the batch process. It shall be assumed that this invention and the varying embodiments described are not restricted by the collection and recycling of the carrier substrates. One who is familiar with the art shall offer various means of conducting carrier collection by manual or automated means dependent upon the sophistication and cost of the tool that is desired.

Once the invention fixture is populated with film frame rings containing affixed device wafer stack containing carrier substrates, the fixture can then be sent to the liquid chemistry to be used for carrier removal. The liquid chemistry operates in a variety of means onto the carrier substrate from adhesion reduction at the bondline location between the carrier and device wafer or works to breakdown the carrier substrate. The invention fixture sidewalls hold the film frame rings in place and upon release of the adhesive that affixes the carrier to the device wafer, the carrier substrates to fall by gravity through the openings of the fixture and continue until they are completely free from the fixture invention. As mentioned, there may optionally be a basket, which collects the carrier substrates below to minimize their falling into the tank bottom.

For film frames which have affixed device wafer stacks containing carrier substrates with a combined thickness of more than twenty five mils=625 um (i.e. 1 mil=0.001 mili inch=25 um) the number of loaded frames per single invention fixture can vary depending upon the construction size of the fixture. General industry standard cassette practice for loading of substrates is approximately twenty-five (25), however, the size of the device wafer cassette may not be the same dimensions of the invention fixture that is desired to hold film frames. The thinned device wafers may be GaAs semiconductor substrates, Si semiconductor substrates, or ceramic substrates for RF and microwave. They may be physically thinned by a grinder, a lapper machine, or a polisher machine, and may as well be chemically thinned by an acid. The semiconductor substrate size can range from one inch to sixteen inches in diameter, and they can be of various shapes, including, but not limited to, circles and rectangles. The carrier substrates can be made of any material that is chemically resistant. Examples include semiconductor substrates, ceramic substrates, sapphire, and glass or quartz substrates. The carrier substrate size can also range from one inch to sixteen inches in diameter, and they can also be physically thinned by a grinder, lapper machine, polisher machine, or they can be thinned by dissolving chemicals. If there is backside alignment through the use of infrared light wave, the support substrates should be optically transparent to allow the infrared light wave to penetrate them. Sapphire and glass carrier substrates are commonly used as support substrates because they are chemically resistant and optically transparent.

The device wafer substrates are mounted onto the carrier substrates using an adhesive material such as a wax, a wax mixed with solvents or other chemicals, or a film that temporarily grips the device wafer to the carrier substrate. The adhesive for mounting the semiconductor substrates onto the support substrates can be of any material that can coat and bond these substrates and withstand the chemical and thermal demands of the process. Removing the carrier substrates from the device wafers may involve a variety of means already mentioned here with a suitable cleaning liquid to remove debris and adhesive material during the separation process.

FIG. 1 outlines the invention fixture that is shown to contain multiple film frame rings 101 with tape 102 identified in FIG. 2. The invention fixture in FIG. 1 requires the insertion of frame rings 101 in FIG. 2 with affixed device wafer 103 and carrier substrate 104 shown in FIG. 3. The device wafers 103 in FIG. 3 are coupled to one or more carrier substrates 104 in FIG. 3 and affixed onto tape 102 in FIG. 2 by contacting tape 102 in FIG. 2 to device wafer 103 in FIG. 3. The tape 102 in FIG. 2 is mounted onto frames 101 in FIG. 2 and populated into the slots of the invention fixture shown in FIG. 1. The device wafers can be made of any material, such as silicon, ceramic, glass, or quartz. Therefore, hereinafter it is understood that the term device wafer can include both semiconducting and non-semiconducting substrates. The device wafers 103 in FIG. 3 are coupled to the carrier substrates 104 in FIG. 3 by an adhesive such as a wax, a wax mixed with chemicals or solvent, or a film gripping material.

During the batch process, the invention fixture in FIG. 1 with inserted frame rings 101 in FIG. 2 with affixed device wafers 103 in FIG. 3 and carrier substrates 104 shown in FIG. 3, the liquid chemical works upon the adhesive between device wafers 103 in FIG. 3 and carrier substrates 104 in FIG. 3, until the adhesive is broken down and allows the carrier substrates 104 in FIG. 3 to begin to separate and fall by gravity away from the device wafers 103 in FIG. 4 allowing carrier substrates 104 shown in FIG. 4 to become fully removed or separated. The invention fixture shown in FIG. 1 allows one or more carrier substrates 104 in FIG. 4 to be separated from device wafers 103 shown in FIG. 4. The invention fixture allows multiples of carrier substrates to be separated and removed in a simultaneous fashion. This practice is described as batch processing where a batch or multiple of the carrier substrates of interest can be acted upon simultaneously.

Various embodiments of this batch processing for carrier substrate removal from device wafers is presented here using an invention fixture desired to hold film frames with affixed device wafers. The invention fixture and its use in batch process carrier substrate removal is not limited by the embodiments presented and shall apply to variations not mentioned here.

What is claimed is:

1. A method of separating a carrier substrate from a thinned device wafer without subsequent damage to the wafer whereby the thinned device wafer is held in a fixture while allowing the carrier substrate to separate and be removed by the effect of gravity wherein the fixture allows the simultaneous separation to occur on one or more thinned device wafers in a batch process wherein the fixture is open in a bottom region such that the open area exceeds the dimensions of the carrier substrate to allow travel downwards through the bottom region and wherein the fixture contains slots on opposing sides of the open area in the bottom region.

2. The method of claim 1, wherein each slot within the fixture retains a film frame while allowing the carrier substrate to travel freely downwards between the slotted area and through the open region in the bottom of fixture.

3. The method of claim 2, wherein the film frame contains an affixed adhesive tape area that bonds directly to the device wafer with a bonded carrier substrate.

4. The method of claim 3, wherein the fixture is exposed to a chemical medium that facilitates the release of the carrier substrate from the device wafer.

5. The method of claim 4, wherein the chemical medium acts upon an interface between the carrier substrate and the device wafer in such a manner to reduce adhesion and allow the carrier substrate to be removed.

6. The method of claim 4 or 5 wherein the chemical medium is compatible with compositions of the fixture, film frame, and corresponding tape.

7. The method of claim 4 or 5, wherein the fixture contains one or more slots corresponding to one or more retained film frames, each with corresponding tape and an affixed device wafer and a bonded carrier substrate, whereby the carrier substrate is removed simultaneously while leaving the device wafer adhered to the taped film frame.

8. The method of claim 7, where the method is performed in a batch process whereby a plethora of carrier substrates are removed simultaneously while leaving the corresponding device wafers adhered to their corresponding taped film frames.

9. The method of claim 4, wherein the chemical medium is an alkali detergent.

10. The method of claim 4, wherein the chemical medium comprises an organic solvent.

* * * * *